United States Patent
Yamada

(10) Patent No.: US 8,963,099 B2
(45) Date of Patent: Feb. 24, 2015

(54) ELECTRODE OF ELECTROSTATIC LENS AND METHOD OF MANUFACTURING THE SAME

(71) Applicant: Canon Kabushiki Kaisha, Tokyo (JP)

(72) Inventor: Shuji Yamada, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/862,728

(22) Filed: Apr. 15, 2013

(65) Prior Publication Data

US 2013/0306878 A1    Nov. 21, 2013

(30) Foreign Application Priority Data

May 17, 2012   (JP) .................. 2012-113097

(51) Int. Cl.
| | |
|---|---|
| H01J 1/02 | (2006.01) |
| H01J 3/18 | (2006.01) |
| H01J 37/317 | (2006.01) |
| H01J 9/02 | (2006.01) |
| H01J 37/12 | (2006.01) |
| H01J 1/46 | (2006.01) |
| H01J 3/02 | (2006.01) |
| H01J 9/14 | (2006.01) |

(52) U.S. Cl.
CPC ... *H01J 1/02* (2013.01); *H01J 3/18* (2013.01); *H01J 37/317* (2013.01); *H01J 9/02* (2013.01); *H01J 37/12* (2013.01); *H01J 37/3177* (2013.01); *H01J 1/46* (2013.01); *H01J 3/027* (2013.01); *H01J 9/14* (2013.01); *H01J 2237/032* (2013.01); *H01J 2237/1205* (2013.01)
USPC ...................... 250/396 R; 250/398

(58) Field of Classification Search
USPC .............................. 250/396 R, 398
See application file for complete search history.

(56) References Cited

U.S. PATENT DOCUMENTS

| | | | | |
|---|---|---|---|---|
| 6,617,595 | B1 * | 9/2003 | Okunuki | 250/492.22 |
| 6,872,950 | B2 * | 3/2005 | Shimada et al. | 250/396 R |
| 2003/0209673 | A1 * | 11/2003 | Ono et al. | 250/396 R |
| 2011/0163244 | A1 * | 7/2011 | Kruit et al. | 250/396 R |
| 2014/0190006 | A1 * | 7/2014 | Setomoto et al. | 29/852 |

FOREIGN PATENT DOCUMENTS

JP       2007-019194 A     1/2007

* cited by examiner

*Primary Examiner* — Phillip A Johnston
*Assistant Examiner* — Hsien Tsai
(74) *Attorney, Agent, or Firm* — Fitzpatrick, Cella, Harper & Scinto

(57) ABSTRACT

An electrode to be used for an electrostatic lens, wherein the electrode at least includes: a first substrate having a first through-hole and a second substrate having a second through-hole; the first substrate having a thickness smaller than the second substrate; the first through-hole having a diameter smaller than the second through-hole; the second substrate having a specific resistance smaller than the first substrate, wherein the first substrate and the second substrate are superimposed so that the first through-hole and the second through-hole are aligned relative to each other. Notching taking place near any of the through-holes in a dry etching process can be reduced, and thus, the through-holes can be formed accurately.

4 Claims, 4 Drawing Sheets

ELECTRODE OF ELECTROSTATIC LENS AND METHOD OF MANUFACTURING THE SAME

BACKGROUND OF THE INVENTION

1. Field of the Invention

The present invention relates to an electrode to be used for an electrostatic lens and a method of manufacturing the same as well as to an electrostatic lens and a charged particle beam exposure apparatus using the same.

2. Description of the Related Art

Electron lenses are employed in electron beam exposure apparatus to control the optical characteristics of electron beams. Electron lenses are classified into the electromagnetic type and the electrostatic type. Electron lenses of the electrostatic type are simple in configuration and advantageous for downsizing if compared with electron lenses of the electromagnetic type. On the other hand, multi-beam systems are known for writing patterns simultaneously by means of a plurality of electron beams without using a mask. Electron lens arrays formed by arranging electron lenses one-dimensionally or two-dimensionally are employed in multi-beam systems.

In the field of electron beam exposure technology, realization of electronic optical elements representing little optical aberrations is important because limitations to micro-machining are determined by optical aberrations of electronic optical elements. Japanese Patent Application Laid-Open No. 2007-019194 discloses an electrostatic type lens for charged particle beam formed as high precision assembly by way of a hole etching process of electrostatic lens where a multi-layer structure of apertures and deflection members is formed and through-holes are produced by etching.

An electrostatic type lens for charged particle beam (to be referred to as electrostatic lens hereinafter) has a simple configuration if compared with an electromagnetic type lens as pointed out above. On the other hand, the optical aberrations of an electrostatic lens are highly sensitive to the manufacturing errors of the lens apertures. In particular, when the lens has a round aperture, the astigmatism thereof is highly sensitive to the symmetry of the aperture contour that may be expressed in terms of circularity. Electron beams converged by an aperture that is asymmetric represent astigmatism and higher order aberrations.

In conventional hole etching processes for electrostatic lenses, when forming a through-hole by etching in a state where a multi-layer structure of apertures and deflection members is prepared, the through-hole is formed from a surface of a deflection member to the rear surface in a single etching operation. As the etching operation proceeds from the etching staring surface side, the pattern transfer accuracy falls to degrade the processing accuracy at the etching ending surface. Particularly, when insulating film of $SiO_2$ or the like is employed as etching stop layer, the stop layer becomes electrically charged to warp the ion trajectories of etching gas, which are apt to give rise to a processing error of etching the lateral surface of the hole, a phenomenon referred to as notching. Most advanced deep etching apparatus include those that are equipped with a feature of lessening the charge of the substrate by detecting the processing terminal point, which is referred to as notchingless processing system. However, such apparatus are costly. Furthermore, the inventors of the present invention examined such costly deep etching apparatus and found that they do not provide an effect of satisfactorily suppressing the increase of aberrations due to errors and lack of accuracy in processing lenses for charged particle beam over the entire conductive electrode substrate surface.

In view of the above-identified problems, therefore, an object of the present invention is to provide an electrode of an electrostatic lens that is processed highly accurately and can prevent notching from taking place in a dry etching process, and a method of manufacturing the same.

SUMMARY OF THE INVENTION

According to the present invention, the above object is achieved by providing an electrode to be used for an electrostatic lens, the electrode at least including: a first substrate having a first through-hole and a second substrate having a second through-hole; the first substrate having a thickness smaller than the second substrate; the first through-hole having a diameter smaller than the second through-hole; the second substrate having a specific resistance smaller than the first substrate, wherein the first substrate and the second substrate are superimposed so that the first through-hole and the second through-hole are aligned relative to each other.

Further features of the present invention will become apparent from the following description of exemplary embodiments with reference to the attached drawings.

DESCRIPTION OF THE EMBODIMENTS

Figure 1:
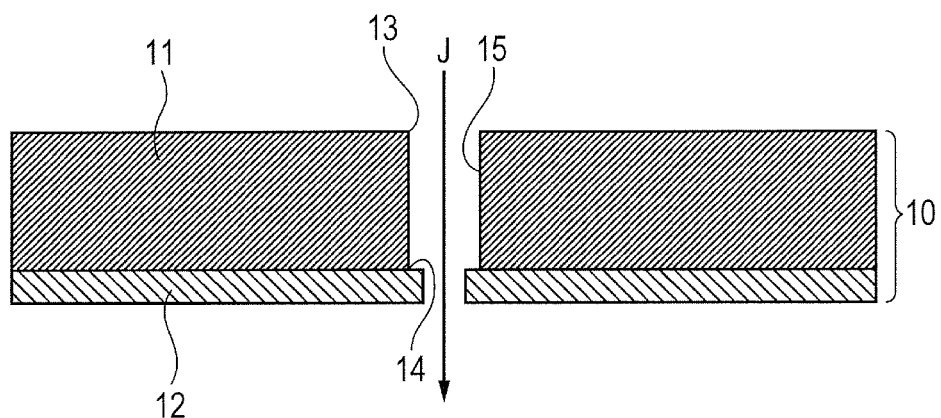
FIG. 1 is a schematic cross-sectional view of an electrode of an electrostatic lens according to the present invention.

Generally, the influence of the aperture portion of a lens on the trajectories of charged particles is reduced as the trajectories of charged particles are separated away from the aperture portion. Therefore, the influence of the processing accuracy of the aperture portion on the charged particle beam of an electrode having a multilayer structure is substantially dominated by the accuracy of small apertures. Thus, small apertures are required to be formed highly accurately, whereas the processing accuracy of large apertures is not required to be particularly high. Now, an embodiment of electrode of an electrostatic lens to be used for charged particle beam J and the method of manufacturing the electrode according to the present invention will be described below by referring to FIG. 1. The method of this embodiment is a method of highly accurately forming a through-hole in the electrode of an electrostatic lens having a single multilayer structure. According to this embodiment, a first through-hole and a second through-hole are formed respectively in substrate (first substrate) 12 and in substrate (second substrate) 11 separately. The substrates are then laid one on the other and aligned with each other by means of the through-holes to produce a single multilayer electrode 10. If compared with a process of forming a through-hole after integrally putting the two substrates one on the other, the through-holes to be formed in the respective substrates are allowed to be shallower.

As the thickness of a substrate and the duration of processing the substrate are increased, not only the processing accuracy at the terminals of the aperture portion falls but also the size accuracy of the aperture entrances is degraded. Additionally, the aspect ratio increases as the thickness of the substrate increases relative to the required aperture diameter. Then, the actual aperture diameters represent variance. Thus, the aperture size accuracy of a through-hole at the surface of an electrode is higher in an electrode that is formed by laying a plurality of substrates one on the other than in an electrode that is formed a single thick electrode.

While an alignment error occurs among the through-holes at the time of laying a plurality of substrates one on the other, such an error occurs only in a single direction and hence can be corrected with ease in an exposure apparatus. To the contrary, in a dry etching process, contamination, crystal defects and vibrations of the apparatus can give rise to a processing error, which is increased from edge 13 of through-hole 15 at the processing starting side toward edge 14 at the processing ending side and the mean free path of ions exerts influence on such an error. Such an error occurs not in a single direction and hence can hardly be corrected. Thus, with the arrangement of this embodiment, errors that can be corrected with ease occur but the ratio of errors that can hardly be corrected can be decreased.

Furthermore, the diameter of the through-hole can be changed from substrate to substrate. Substrate 12 has a small thickness and a through-hole that is highly accurate and has a small diameter. Therefore, by laying the substrate 12 on the substrate 11 at the processing ending side of the substrate 11 where the processing accuracy is lowered, the contribution ratio of the worsened processing accuracy at the edge 14 of the processing ending side falls so that a high precision electrode can be obtained as multilayer electrode 10.

As the material of a substrate, silicon is suitable because it is easily available and a popular processing apparatus and a popular process can be applied to it. A substrate that is poorly doped and represents a high electric resistance value is preferable for substrate 12. A material to which a semiconductor process is applicable for forming a through-hole is preferably employed for each of the substrates. Therefore, an Si single crystal wafer is preferably employed for the substrates. The substrates 11 and 12 desirably represent conductivity so as to be used as electrode substrates. When the substrates are made of Si, $SiO_2$ film or metal film is formed on the surfaces of the Si substrates as mask members and a patterning operation is conducted on them by means of photolithography and etching.

As etching technique to be employed for patterning the substrates, a Bosch process of alternately using $SF_6$ gas and $C_4F_8$ gas, an isotropic etching process of using either $SF_6$ or $CF_4$, or an anisotropic etching process of using a mixture gas of $SF_6$ and $CHF_3$ may be selected. One or more holes can be formed in the Si wafer as alignment marks in the process of forming a through-hole. The holes that are formed as alignment marks may be through-holes that run through the substrates or blind via holes. The substrates to be bonded together are aligned by an operator who is observing the alignment marks through a microscope. In case of using visible light, the alignment marks on the surfaces of the substrates are observed from the front and back of the substrates to align the substrates. After the substrates are laid one on the other and aligned with each other, they are bonded together so as to be secured to each other to produce a single multilayer electrode 10. The aberrations of the obtained lens for charged particle beam can be reduced by laying the substrate 12 that is processed to a higher patterning accuracy and has a thickness smaller than the other substrate 11 on the aperture side of the latter substrate that is processed with a lower accuracy. After the substrates are laid one on the other, they may be secured to each other by fusion bonding, direct bonding, anode bonding or rigidly securing them to each other by means of an adhesive after aligning them.

Now, the present invention will be described further by way of examples.

Example 1

As Example 1, a process of manufacturing an electrode to be used for an electrostatic lens realized by applying the present invention will be described below.

FIGS. 3A through 3F illustrate the process of forming substrate (second substrate) 11. Firstly, a silicon substrate (original substrate) having an outer diameter of 4 inches, a substrate thickness of 525 μm and a specific resistance of 0.001 to 0.003 Ωcm is brought in and processed in a pyrogenic furnace at 1050° C. for 4 hours to form a thermal oxide film on the entire surface of the substrate to a thickness of 500 nm.

Figure 3A:
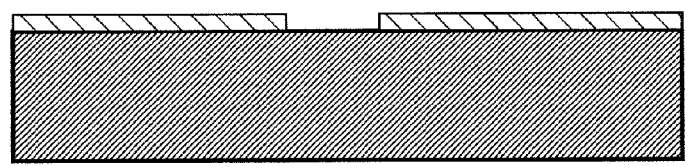
FIGS. 3A, 3B, 3C, 3D, 3E and 3F are schematic views of the method of manufacturing the electrode of the electrostatic lens of Example 1 according to the present invention.

Subsequently, a 200 nm-thick Cr film is formed for a hard mask by dry etching and then a hard mask having a circular pattern with an outer diameter of 36 μm is formed by way of an ordinary photolithography process (FIG. 3A).

Thereafter, a via hole is formed from the first surface of the original substrate to the second surface, or the surface opposite to the first surface.

Figure 3B:
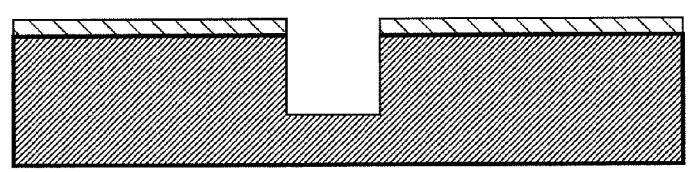

More specifically, the 500 nm-thick thermal oxide film is subjected to a dry etching process by means of $CHF_3$ gas, using the Cr film as mask, and then a round via hole having a depth of 90 μm and representing an aspect ratio of about 3 is formed by way of a Bosch process using $SF_6$ gas and $C_4F_8$ gas (FIG. 3B). With this arrangement, notching that is detrimental to the processing dimensions does not occur at all because there is not any etching stop layer.

Then, after removing the CFx based deposit adhering to the inner wall of the via hole and the Cr hard mask by means of oxygen plasma asking and thoroughly cleansing the substrate with sulfuric acid/hydrogen peroxide water, a 100 nm-thick thermal oxide film was formed again in a pyrogenic furnace.

As a result, a substrate having an about 510 nm-thick thermal oxide film formed on the top surface of the substrate and a 100 nm-thick thermal oxide film formed on the inner surface and the bottom surface of the substrate that have been etched is completed.

Then, the substrate is subjected to an etching process using $CHF_3$ gas in a low pressure condition in order to remove the thermal oxide film on the etched bottom surface of the substrate. Because the top surface of the substrate and the bottom surface of the hole cannot be etched selectively and the etching rate is rather higher on the top surface, a 500 nm-thick thermal oxide film is formed in advance on the entire surface of the substrate as sacrificial layer.

What is important in this step is that only the oxide film on the bottom surface of the via hole has been removed in order to make plating grow from the Si on the bottom by electroplating and fill the via hole with an infill.

Figure 3C:
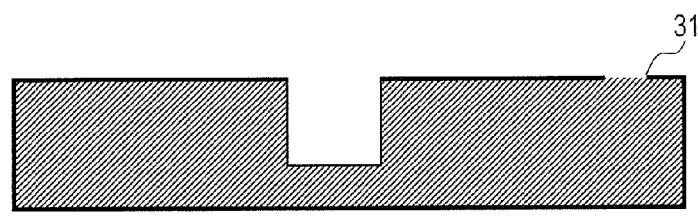

Then, a Cu film is formed to a thickness of 50 nm from a vertical direction by way of an evaporation process having a high directionality. A 10 nm-thick Cr film is formed as undercoating in order to make the Cu plating adhere well to the substrate. Subsequently, the Cu film around the substrate is partly removed by means of a mixed acid etchant and the oxide film was removed by means of BHF (buffer hydrogen fluoride) to expose the Si of the substrate itself and form electrode terminal section 31 (FIG. 3C).

Figure 3D:
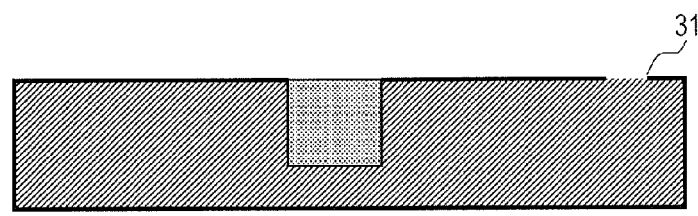

Thereafter, plating is made to grow from the bottom surface of the via hole by flowing an electric current from the bottom surface of the via hole by way of the electrode terminal section 31 in a Cu plating solution and the via hole was filled with Cu (FIG. 3D).

Figure 3E:
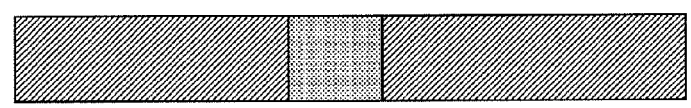

Then, the silicon substrate was ground back from the rear surface thereof (from the side of the second surface) so as to be thinned to 93 μm and a substrate having a total thickness of 88 μm is obtained by polishing the front and rear surfaces of the substrate by means of CMP (chemical mechanical polishing) (FIG. 3E).

Figure 3F:

Finally, substrate 11 having a through-hole is obtained by etching the Cu by means of mixed acid and removing the Cu filling (FIG. 3F).

Now, the process of forming substrate 12 will be described below by referring to FIGS. 4A through 4C.

The substrate that is brought in is an SOI (silicon on insulator) substrate having a 6 μm-thick device layer 41, a 1.5 μm-thick BOX (Buried Oxide) layer 42 and a 512 μm-thick handle layer 43. The specific resistance of the device layer is 1 to 10 Ωcm.

Figure 4A:
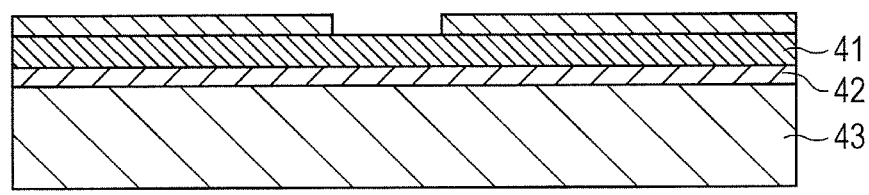
FIGS. 4A, 4B and 4C are another schematic views of the method of manufacturing the electrode of the electrostatic lens of Example 1 according to the present invention.

Cr is deposited on the surface of the device layer by evaporation to a thickness of 200 nm for the purpose of forming an etching hard mask and then a circular pattern having an open hole diameter of Φ30 μm is formed by means of ordinary lithography and dry etching (FIG. 4A).

Then, an open hole having a diameter Φ30 μm and a depth of 6 μm is formed by anisotropic etching, using a mixture gas of $SF_6/CHF_2$.

Figure 4B:
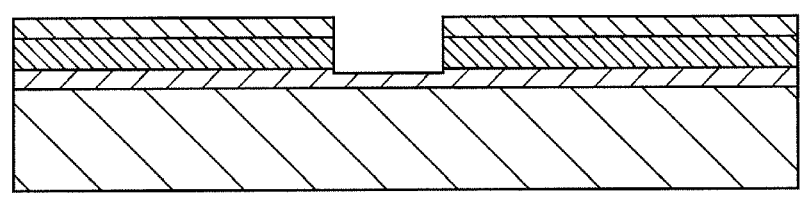
Figure 4C:
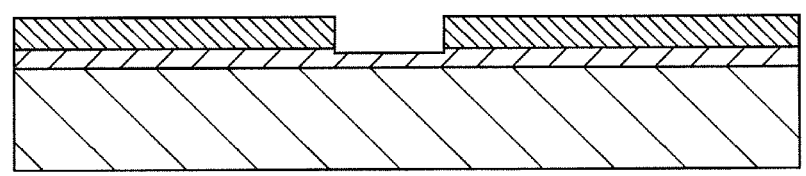

At this time, the device layer can be dug in to a certain extent without making the BOX layer operate as stop layer by adjusting the ratio of $SF_6/CHF_2$ and reducing the selection ratio of silicon and $SiO_2$ so that a high precision aperture representing no notch can be formed in the thin device layer (FIG. 4B).

Subsequently, after removing the mask and cleansing the substrate, a 100 nm-thick thermal oxide film is formed in a pyrogenic thermal oxidation furnace. The thermal oxide film on the surface is required at the time of fusion boding. The part of the device layer in FIG. 4C becomes substrate 12.

Then, the etching terminating side in the sense of progress of etching of the substrate 11 and the surface of the device layer of the substrate 12 are accurately aligned with each other and the two substrates are subjected to fusion bonding and integrally combined with each other.

Furthermore, the handle layer of the SOI substrate is ground back and released by wet etching using TMAH (tetramethyl ammonium hydroxide) and the BOX layer is removed by means of BHF to ultimately obtain an integral type multilayer electrode 10.

As a multilayer electrode 10 to be used for an electrostatic lens is formed in this way, a method of manufacturing a multilayer electrode that can achieve a high processing accuracy if compared with an electrode prepared by simply boring a through-hole in a single 94 μm-thick silicon wafer can be established.

Example 2

Figure 2:
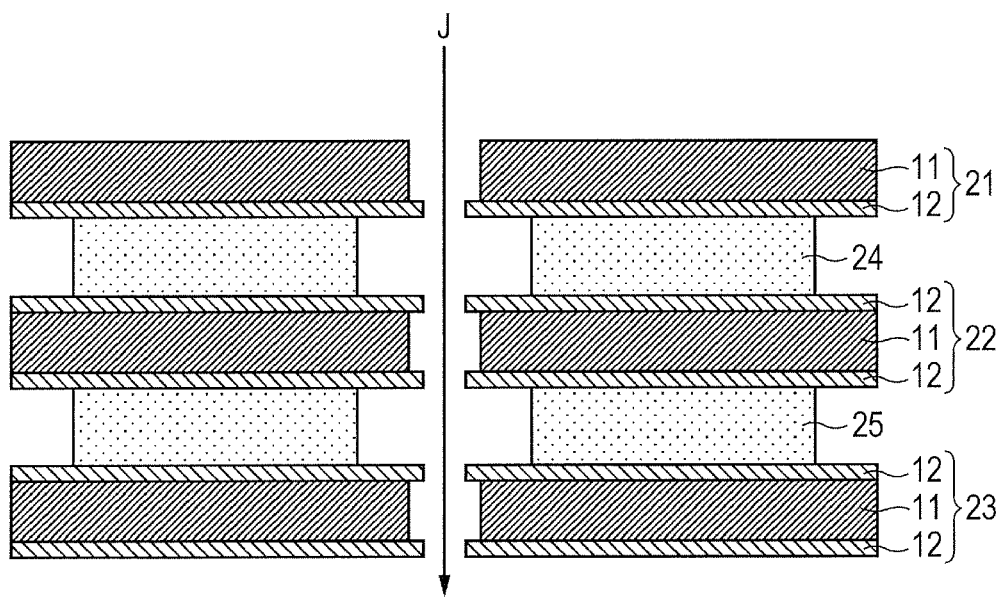
FIG. 2 is a schematic cross-sectional view of the electrostatic lens of Example 2 according to the present invention.

An electrostatic lens having a plurality of lens electrodes configured by applying the present invention will be described below as Example 2 by referring to FIG. 2.

In this example, each of multilayer electrodes 21, and 23 is configured as multilayer electrode (lens electrode) same as the one obtained in Example 1. The multilayer electrode 22 for which the highest processing accuracy is required so as to be used in an electrostatic lens is formed by also laying substrate 12 obtained by high precision processing using SOI, which is described above, on the substrate 11 at the etching starting side of the substrate 11. Thus, the multilayer electrode 22 is a three-layer electrode for which a high aperture diameter accuracy level is achieved.

Similarly, either or both of multilayer electrodes 21 and 23 may be formed as three-layer electrode or electrodes, whichever appropriate, representing a high aperture accuracy level.

In Example 2, the degree of contribution of the accuracy of the aperture dimensions of each of the multilayer electrodes to the aberrations of the electrostatic lens is determined by the electric potential given to the electrode and the position of the electric potential. In this example, −3.7 kV is applied to the multilayer electrode 22 at the middle and the top and bottom multilayer electrodes 21 and 23 are grounded.

As a result, charged particles bearing negative electric charges are strongly decelerated near and converged to the multilayer electrode 22. In other words, the multilayer electrode 22 takes an important role and the dimensional accuracy level of the aperture thereof is highly influential to the aberrations of the electrostatic lens.

On the other hand, the charged particle beam receiving side of the multilayer electrode 21 and the electron releasing side of the multilayer electrode 23 are not highly influential to the aberrations of the electrostatic lens if the processing accuracy levels thereof are relatively low.

The three multilayer electrodes are electrically insulated from each other by means of supports 24 and 25. The supports 24 and 25 are arranged at positions that do not hang over the aperture portions of the multilayer electrodes 21, 22 and 23. The aperture portions of the supports are required to be recessed sufficiently from the aperture portions of the multilayer electrodes.

This is because, if the aperture portions of the supports are not recessed sufficiently from the aperture portions of the multilayer electrodes, charged particles passing through the aperture portions of the multilayer electrodes can partly be scattered and collide with the wall surfaces of the supports to charge the wall surfaces with electricity and change the electric field there. Then, the trajectories of the charged particles to by turn aggravate the aberrations.

The supports are made of ceramic, alkali glass, or non-alkali glass. Any of such materials representing a linear expansion coefficient close to that of silicon needs to be selected for the supports.

Now, specific exemplar materials and dimensions of the electrostatic lens of this example will be described below.

The method of manufacturing multilayer electrodes 21, 22 and 23 is same as the one described in Example 1. The outer diameter of the multilayer electrodes is 4 inches. The thickness of the multilayer electrode 21 is 94 μm and that of the multilayer electrodes 22 and 23 is 100 μm.

A through-hole is bored through each of the electrodes and the aperture diameter of the thinner electrode (the first substrate) is 30 μm, while the aperture diameter of the thicker electrodes (the second substrate) is 36 μm.

The supports 24 and 25 are made of Pyrex (registered trade name) glass and have an outer diameter of 4 inches, which is same as that of the multilayer electrodes, and a thickness of 400 μm.

The aperture of each of the supports is formed by putting a photosensitive dry film onto the support, subsequently forming a pattern on it by means of lithography and processing it by sand-blasting.

Thereafter, the processed surfaces of the supports are treated by wet etching and surface polishing to remove microcracks and burrs.

The apertures of the supports are recessed by 2 mm from the apertures of the multilayer electrodes.

Then, the multilayer electrodes 21, 22 and 23 and the supports 24 and 25 are satisfactorily aligned and sequentially laid one on the other. Finally, they are firmly secured to each other.

The substrates and the supports are firmly secured to each other at edge portions thereof by means of a heat-resistant silicone based adhesive agent.

Example 3

A charged particle multi-beam exposure apparatus formed by using an electrostatic lens according to the present invention will be described below as Example 3 by referring to FIG. 5.

The exposure apparatus of this example is configured as so-called multi-column type exposure apparatus which has individual projection systems. The electron beams for irradiation that are drawn out from electron source 108 by means of an anode electrode 110 are made to form irradiation optical system crossover 112 by crossover adjusting optical system 111. Reference numeral 109 denotes a wehnelt electrode.

A so-called thermoelectron type electron source formed typically by using $LaB_6$ or BaO/W (dispenser cathode) is employed for the electron source 108.

The crossover adjusting optical system 111 is formed by electrostatic lenses arranged in two stages. Each of the first stage and second stage electrostatic lenses includes three electrodes. The electrostatic lenses are so-called einzel type electrostatic lenses, in which a negative voltage is applied to the intermediate electrode and the upper and lower electrodes are grounded.

The electron beams 114 broadly irradiated from the irradiation optical system crossover 112 are turned to parallel beams 116 that run in parallel with main electron beam 113 by means of a collimator lens 115 and irradiated to aperture array 117. The multi electron beams 118 separated by the aperture array 117 are independently converged by focusing lens array 119 and focused on blanker array 122. Reference numeral 120 denotes an aligner.

The focusing lens array 119 is formed by an electrostatic lens including three porous electrodes that is a so-called einzel type electrostatic leans array, in which a negative voltage is applied to the intermediate electrode and the upper and lower electrodes are grounded.

The aperture array 117 is placed at the pupil plane position of the focusing lens array 119 (the front focal plane position of the focusing lens array) in order to have it take a role of defining the NA (focusing half angle).

The blanker array 122 is a device having separate deflection electrodes that controls ON/OFF of individual beams based on the blanking signal generated by a drawing pattern generating circuit 102, a bitmap conversion circuit 103 and a blanking command circuit 106 and according to a drawing pattern.

In the state where the beam is ON, voltage is not applied to the deflection electrodes of the blanker array 122, and in the state where the beam is OFF, voltage is applied to the deflection electrodes of the blanker array 122 to deflect the multi electron beam.

The multi electron beam 125 that is deflected by the blanker array 122 is blocked by stop aperture array 123 arranged downstream to turn the beam into an OFF state.

Similarly, the multi electron beam 129 that is deflected by the second blanker array 127 is blocked by second stop aperture array 128 arranged downstream to turn the beam into an OFF state.

The blanker arrays of this example are arranged at two separated stages. The second blanker array 127 and the second stop aperture array 128 having structures respectively same as that of the blanker array 122 and that of the stop aperture array 123 are arranged downstream. The multi electron beams 124 that pass through the blanker array 122 are focused on the second blanker array 127 by the second focusing lens array 126.

Furthermore, the multi electron beams are converged by the third focusing lens array 130 and the fourth focusing lens array 132 and focused on wafer 133.

The second focusing lens array 126, the third focusing lens array 130 and the fourth focusing lens array 132 are einzel type electrostatic lens arrays like the focusing lens array 119.

Particularly, the fourth focusing lens array 132 operates as objective lens whose demagnification factor is set to about 100 times.

As a result, the electron beams 121 on the intermediate image plane of the blanker array 122 (having a spot diameter of 2 µm in terms of FWHM (full width at half maximum)) are demagnified to one-hundredth on the surface of the wafer 133 and the multi electron beam is focused on the wafer with a FWHN of about 20 nm. The fourth focusing lens array 132 operates as electrostatic lens array for charged particle beam like the one illustrated in Example 2.

The electron beams on the wafer can be made to scan by means of a deflector 131. The deflector 131 is formed by using opposite electrodes arranged in four stages so as to operate for deflection in two stages in x- and y-directions (deflectors of two stages are illustrated as a unit in FIG. 5 for the purpose of simplification).

The deflectors 131 are driven by a signal from deflection signal generating circuit 104.

The wafer 133 is driven to continuously move in X-direction by stage 134 during pattern drawing operations.

The electron beams 135 on the wafer surface are deflected in the Y-direction by the deflector 131, referring to the length measured by a laser length measuring machine on a real time basis. The beams are individually turned ON/OFF according to the drawing pattern by the blanker array 122 and the second blanker array 127.

Thus, with the above-described arrangement, a desired pattern can be drawn at a high speed on the surface of the wafer 133.

Images can be formed with little aberrations by using an electrostatic lens array according to the present invention.

Therefore, then, a charged particle multi-beam exposure apparatus that can produce micro patterns can be realized. The number of multi beams can be increased because the thickness of the related electrode can be increased if the aperture forming area where a multi beam passes is increased. Thus, a charged particle multi-beam exposure apparatus that can produce patterns at a high speed can be realized.

Additionally, a charged particle multi-beam exposure apparatus can be provided at a low cost because since low cost electrostatic lenses can be employed for it.

Furthermore, if the number of electrostatic lenses of an electrostatic lens arrays is increased and the aperture forming area is increased, the yield of manufacturing electrostatic lens array can be prevented from falling and a low cost exposure apparatus can be manufactured.

An electrostatic lens array according to the present invention can be used as focusing lens array such as focusing lens array 119, second focusing lens array 126 or third focusing lens array 130.

Figure 5:
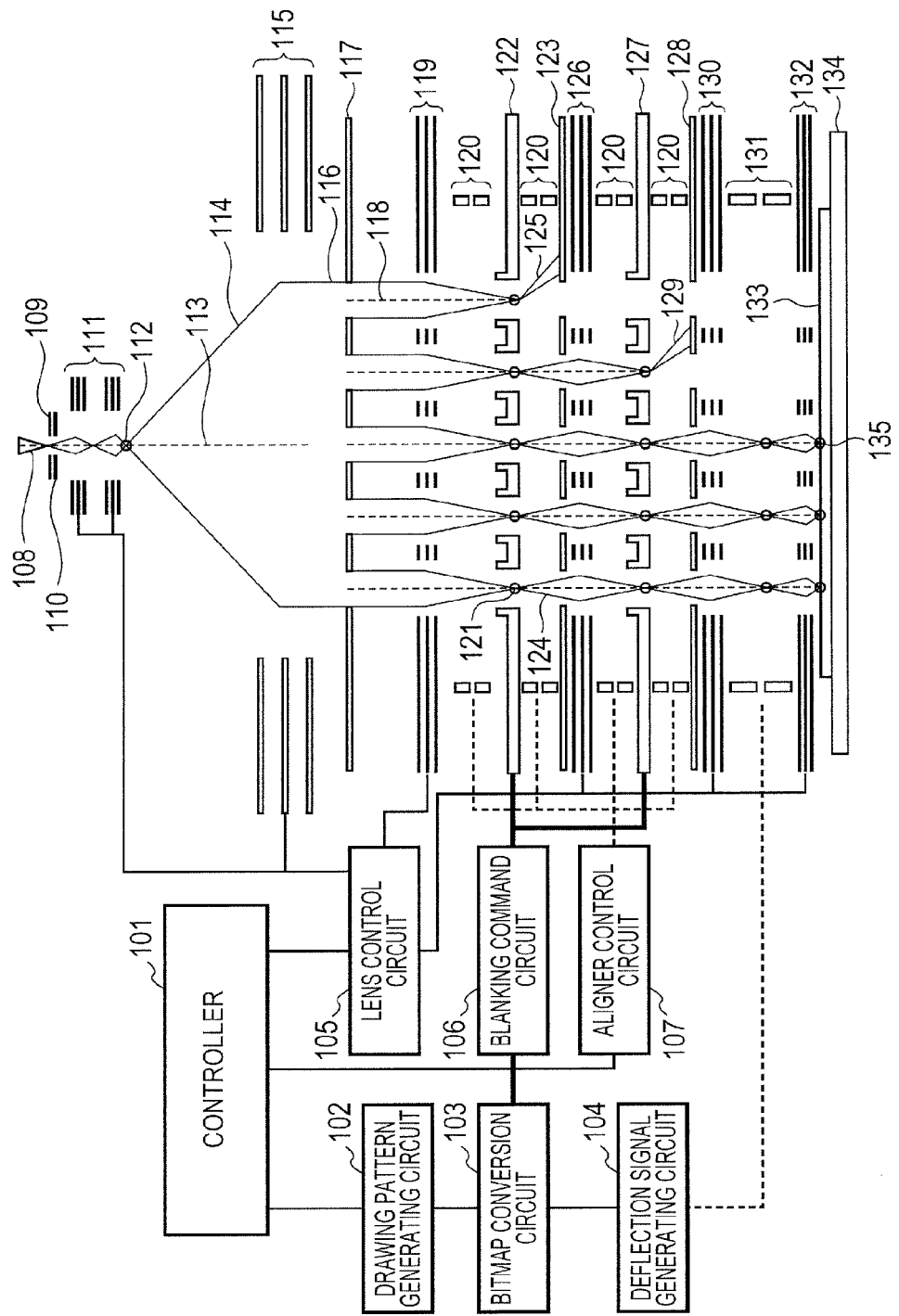
FIG. 5 is a schematic conceptual illustration of the charged particle beam exposure apparatus of Example 3 according to the present invention.

An electrostatic lens according to the present invention can be applied to a charged particle beam exposure apparatus adapted to use only a single beam instead of a plurality of beams as illustrated in FIG. 5.

In such an instance, a charged particle multi-beam exposure apparatus that can produce micro patterns can be realized by using lenses with little aberrations.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-113097, filed May 17, 2012, which is hereby incorporated by reference herein in its entirety.

What is claimed is:

1. A method of manufacturing an electrode to be used for an electrostatic lens, the method comprising:
   - a step of preparing a first substrate having a first through-hole;
   - a step of forming a second through-hole in an original substrate, which is to be processed into a second substrate, from a side of a first surface of the original substrate toward a second surface opposite to the first surface, wherein the second through-hole has a diameter greater than the first through-hole, and the second substrate has a specific resistance smaller than the first substrate; and
   - a step of superimposing the first substrate and the second substrate by way of aligning the first through-hole and the second through-hole relative to each other and then laying the first substrate on the second surface of the second substrate, after the step of forming the second through-hole.

2. The method according to claim 1, wherein the first substrate has a thickness smaller than the second substrate.

3. The method according to claim 1, wherein the step of forming the second through-hole comprises:
   - a step of forming a hole in the original substrate from the side of the first surface of the original substrate, the hole being not a through-hole getting to the second surface opposite to the first surface;
   - a step of filling the hole with an infill by means of electroplating;
   - a step of thinning the original substrate filled with the infill from a side of the second surface thereof; and
   - a step of removing the infill from the thinned original substrate.

4. The method according to claim 1, wherein the first through-hole and/or the second through-hole is formed without using an etching stop layer.

* * * * *